(12) United States Patent
Vatchkov et al.

(10) Patent No.: US 7,664,715 B2
(45) Date of Patent: Feb. 16, 2010

(54) APPARATUS AND METHOD FOR COMPRESSING DATA, APPARATUS AND METHOD FOR ANALYZING DATA, AND DATA MANAGEMENT SYSTEM

(75) Inventors: Gantcho Lubenov Vatchkov, Takamatsu (JP); Koji Komatsu, Takamatsu (JP); Satoshi Fujii, Tokyo (JP); Isao Murota, Tokyo (JP)

(73) Assignee: Caterpillar Japan Ltd., Tokyo (JP)

( * ) Notice: Subject to any disclaimer, the term of this patent is extended or adjusted under 35 U.S.C. 154(b) by 327 days.

(21) Appl. No.: 11/628,323

(22) PCT Filed: Apr. 28, 2005

(86) PCT No.: PCT/JP2005/008170
§ 371 (c)(1),
(2), (4) Date: Dec. 4, 2006

(87) PCT Pub. No.: WO2006/001121

PCT Pub. Date: Jan. 5, 2006

(65) Prior Publication Data
US 2007/0233623 A1     Oct. 4, 2007

(30) Foreign Application Priority Data
Jun. 25, 2004  (JP) .............................. 2004-188419

(51) Int. Cl.
*G06E 1/00*    (2006.01)
*G06E 3/00*    (2006.01)
*G06F 15/18*   (2006.01)
*G06G 7/00*    (2006.01)
*G06N 3/02*    (2006.01)

(52) U.S. Cl. ...................................................... 706/15
(58) Field of Classification Search .................... 706/15
See application file for complete search history.

(56) References Cited

U.S. PATENT DOCUMENTS
5,293,634 A * 3/1994 Takahashi et al. ........... 709/245
(Continued)

FOREIGN PATENT DOCUMENTS
JP           7-21029 A     1/1995
(Continued)

OTHER PUBLICATIONS

Multiplicity Adjustment for Intersection-union Test: DetectingOverlapping Genes from Multiple Microarray Gene Lists Deng, Xutao; Xu, Jun; Wang, Charles; Computer and Computational Sciences, 2007. IMSCCS 2007. Second International Multi-Symposiums on Aug. 13-15, 2007 pp. 52-59 Digital Object Identifier 10.1109/IMSCCS.2007.4392580.*

(Continued)

*Primary Examiner*—Michael B Holmes
(74) *Attorney, Agent, or Firm*—Birch, Stewart, Kolasch & Birch, LLP

(57) ABSTRACT

There are provided an apparatus and a method for compressing data, an apparatus and a method for analyzing data and a data management system, which are capable of compressing huge data and accurately reproducing the characteristics of the original data from the compressed data.

The data compressing apparatus includes detection means for detecting a multiplicity of data sets, each including n parameter values that vary according to an operation of an object, where n is a natural number; and data compressing means for compressing the data sets by inputting the data sets into an n-dimensional space, arranging neurons smaller in number than the data sets in the n-dimensional space, carrying out unsupervised learning for a neural network on the neurons, and converting the data sets into a neuron model parameter characterizing a neuron model obtained by the unsupervised learning.

4 Claims, 12 Drawing Sheets

U.S. PATENT DOCUMENTS

| | | | |
|---|---|---|---|
| 5,440,733 A * | 8/1995 | Yamazaki et al. | 707/100 |
| 5,774,629 A | 6/1998 | Yamaguchi et al. | |
| 6,115,757 A * | 9/2000 | Honda | 710/22 |
| 6,459,504 B1 * | 10/2002 | Murano et al. | 358/406 |
| 6,547,665 B2 * | 4/2003 | Kubo et al. | 463/43 |
| 6,622,112 B2 * | 9/2003 | Kinoshita et al. | 702/150 |
| 6,633,244 B2 * | 10/2003 | Avery et al. | 341/60 |
| 6,658,287 B1 * | 12/2003 | Litt et al. | 600/544 |
| 6,675,136 B1 * | 1/2004 | Gottfries et al. | 703/2 |
| 6,728,728 B2 * | 4/2004 | Spiegler et al. | 707/103 R |
| 6,847,737 B1 * | 1/2005 | Kouri et al. | 382/260 |
| 6,876,779 B2 * | 4/2005 | Rising, III | 382/276 |
| 7,082,419 B1 * | 7/2006 | Lightowler | 706/15 |
| 7,170,997 B2 * | 1/2007 | Petersen et al. | 380/268 |
| 7,251,637 B1 * | 7/2007 | Caid et al. | 706/15 |
| 7,272,265 B2 * | 9/2007 | Kouri et al. | 382/260 |
| 7,389,208 B1 * | 6/2008 | Solinsky | 703/2 |
| 7,469,065 B2 * | 12/2008 | Kecman et al. | 382/232 |
| 7,471,724 B2 * | 12/2008 | Lee | 375/240.12 |

FOREIGN PATENT DOCUMENTS

| | | |
|---|---|---|
| JP | 8036557 A | 2/1996 |
| JP | 9-70048 A | 3/1997 |
| JP | 10-273920 A | 10/1998 |
| JP | 2000-266570 A | 9/2000 |
| JP | 2001-76172 A | 3/2001 |
| JP | 2002-180502 A | 6/2002 |
| JP | 2003-83848 A | 3/2003 |
| JP | 2003-296696 A | 10/2003 |

OTHER PUBLICATIONS

Two-value image data compressing and recovering using improved neural network Dai Kui; Shen Qing; Shouron Hu; Industrial Electronics, 1992., Proceedings of the IEEE International Symposium on May 25-29, 1992 pp. 491-494 vol. 1 Digital Object Identifier 10.1109/ISIE.1992.279648.*

Image data compression using a neural network model Sonehara, N.; Kawato, M.; Miyake, S.; Nakane, K.; Neural Networks, 1989. IJCNN., International Joint Conference on Jun. 18-22, 1989 pp. 35-41 vol. 2 Digital Object Identifier 10.1109/IJCNN.1989.118675.*

Winner-take-all neural network for visual handwritten character recognition Tayel, M.; Shalaby, H.; Saleh, H.; Radio Science Conference, 1996. NRSC '96., Thirteenth National Mar. 19-21, 1996 pp. 239-249 Digital Object Identifier 10.1109/NRSC.1996.551115.*

Image compression using a feedforward neural network Setiono, R.; Guojun Lu; Neural Networks, 1994. IEEE World Congress on Computational Intelligence., 1994 IEEE International Conference on vol. 7, Jun. 27-Jul. 2, 1994 pp. 4761-4765 vol. 7 Digital Object Identifier 10.1109/ICNN.1994.375045.*

Vachkov, Gancho, Turk J Elec Engin, vol. 12, No. 1, 2004, pp. 27-42.

Terashima, M. et al., The Transactions of the Institute of Electronics, Information and Communication Engineers, J79-D-II, No. 7, pp. 1280-1290, Jul. 25, 1996.

G. Vachkov, et al, "Real-Time Classification Algorithm for Recognition of Machine Operating Modes by Use of Self-Organizing Maps", Turkish Journal of Electrical Engineering & Computer Sciences, vol. 12 No. 1, p. 27-42, Mar. 2004.

M. Terashima, et al., "Unsupervised Cluster Segmentation Method Using Data Density Histogram on Self-Organizing Feature Map", The Transactions of The Institute of Electronics, Information and Communication Engineers, J79-D-II, No. 7, The Institute of Electronics, Information and Communication Engineers Inc., p. 1280-1290, Jul. 25, 1996.

M. Terajima "Cluster Classifying Device" Japanese Patent Laid-Open (Kokai) No. HEI 8-36557, Laid-Open Date: Feb. 6, 1996, Abstract.

N. Matsui, et al., "Clustering Device and Clustering Method" Japanese Patent Laid-Open (Kokai) No. 2003-296696, Laid-Open Date: Oct. 17, 2003, Abstract.

Vachkov, et al., Proc. of the 7th Joint Conference on Information Sciences, Sep. 2003, pp. 1375-1380.

Japanese Patent Office Notification of Reasons for Refusal (JP-2004-188419), Sep. 26, 2006 (English Translation attached).

* cited by examiner

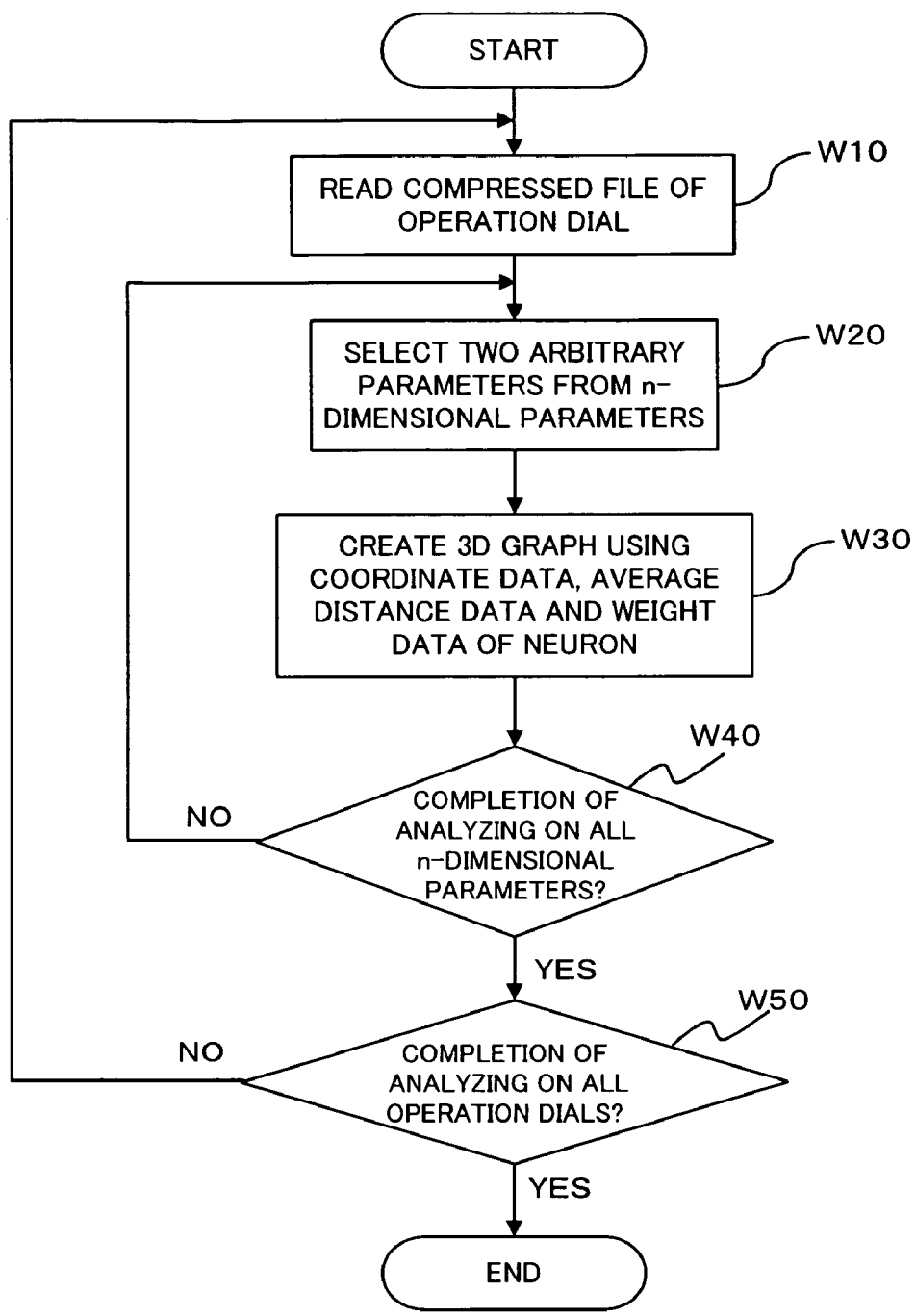

APPARATUS AND METHOD FOR COMPRESSING DATA, APPARATUS AND METHOD FOR ANALYZING DATA, AND DATA MANAGEMENT SYSTEM

TECHNICAL FIELD

The present invention relates to an apparatus and a method for compressing data, an apparatus and a method for analyzing data, and a data management system preferably used for compression of a huge amount of data.

BACKGROUND OF THE INVENTION

In recent years, the finite resources of the earth and excessive environmental burdens have lead to great need for new ways of maintaining machines that focus on resource circulation and reduction in environmental impact so that contemporary expendable society is converted to sustainable society.

Conventional machine maintenance employs corrective maintenance in which a machine is repaired after it breaks down, or uniform preventive maintenance which is performed at predetermined intervals. Corrective maintenance entails a great deal of time and cost for repair. Preventive maintenance generates unnecessary part and oil waste due to its uniformity and thereby imposes greater costs on customers. Further preventive maintenance is expensive because of the intensive labor required. There is a requirement for a departure from such conventional maintenance manners and for conversion to predictive maintenance in the future.

In predictive maintenance, the degree of soundness is diagnosed by understanding data of load and environment during operation, a database of past maintenance history, physical failure and others and further deterioration and remaining life are predicted in order to anticipate a defect on a machine at an early stage and to provide a safe operation environment.

Normally, in such a system employing predictive maintenance, sensors installed in an object machine detect an operation state of the machine, a data collector installed in the machine collects the raw data representing the operation state and sends the raw data to a computer in a management center (for example, a service department of a company in charge of maintenance of the machine) in real time or at predetermined intervals. Upon receipt of the raw data, the computer analyzes the raw data and diagnoses the soundness of the machine.

However, the amount of raw data collected by the data collector is huge and is sent from the machine to the management center through telecommunications, which may be unreliable and costly. One solution is compression of the raw data and sending of the compressed data to the management center. For example, the Patent Reference 1 discloses a method for compressing time-series operation signals obtained by sensors into histogram data or frequency distribution data. Further, the Patent Reference 2 discloses a method for modifying intervals to send an operation signal in accordance with a failure probability (a bathtub curve), and the Patent Reference 3 discloses a method for accumulating a frequency of detection per unit time in order to save memory capacity and judge the state of an object machine from the histogram.

Patent Reference 1: Japanese Patent Application Laid-Open Publication No. 2003-083848

Patent Reference 2: Japanese Patent Application Laid-Open Publication No. 2002-180502

Patent Reference 3: Japanese Patent Application Laid-Open Publication No. HEI 10-273920

DISCLOSURE OF THE INVENTION

Problem to be Solved by the Invention

Despite the techniques of the above three Patent References 1-3, it is difficult to accurately reproduce the characteristics of the original data (i.e., raw data) from the compressed data.

Alternatively, a moving average of raw data may be calculated so that the raw data is compressed into lower volume data, which is to be sent to the management center. However, similarly to the above patent references, the characteristics of the raw data cannot be accurately reproduced.

Means to Solve the Problem

With the foregoing problems in view, the first object of the present invention is to provide an apparatus and a method for compressing a huge amount of data, so that the characteristics of the original data can be accurately reproduced from data obtained by the compression.

The second object of the present invention is to provide an apparatus and a method for analyzing the data compressed by the above apparatus and the method for compressing data, and a data management system including the above data compressing apparatus and the data analyzing apparatus.

To attain the above objects, there is provided a data compressing apparatus comprising: detecting means for detecting a multiplicity of data sets, each of which includes n parameter values that vary according to an operation of an object, where n is a natural number; and compressing means for compressing the multiple data sets by inputting the multiple data sets detected by the detecting means into an n-dimensional space, arranging a predetermined number of neurons which are smaller in number than the multiple data sets in the n-dimensional space, carrying out unsupervised learning of a neural network on the neurons to obtain a neuron model, and calculating neuron model parameters by use of the multiple data sets and the neuron model.

In another aspect of the present invention, the data compressing means is further characterized in that: the compressing means determines one neuron of the neurons for each of the multiple data sets which one neuron has the shortest distance to each of the multiple data sets to be a winning neuron; and the neuron model parameters include, for each of the winning neurons, coordinate data representing coordinates of each of the winning neuron, average distance data representing an average of distances of each of the winning neurons to the multiple data sets, and weight data representing how many times each of the winning neurons determined is to be a winning neuron.

In another aspect of the present invention, the apparatus for compressing data is further characterized in that: the compressing means deletes one or more neurons that have never been determined to be winning neurons after the completion of the unsupervised learning.

In another aspect of the present invention, the apparatus for compressing data further comprises sending means for sending the neuron model parameters to an external unit.

There may be further provided a data analyzing apparatus comprising: receiving means, disposed in the external unit, for receiving the neuron model parameter sent from the sending means of the data compressing apparatus; and analyzing means for analyzing the multiple data sets based on the neuron model parameter received by the receiving means.

In another aspect of the present invention, the data analyzing apparatus is further characterized in that the analyzing means carries out the analyzing by calculating a moving average of the neurons based on coordinate data and weight data included in the neuron model parameters.

In another aspect of the present invention, the data analyzing apparatus is further characterized in that the analyzing means carries out the analyzing by calculating a density distribution of the multiple data sets based on the coordinate data, the average distance data, and the weight data included in the neuron model parameters.

According to the present invention, there may be further provided a data management system comprising: a data compressing apparatus and a data analyzing apparatus.

The data management system is further characterized in that the object is a construction machine and the n parameter values vary according to an operation performed by the construction machine.

According to the present invention, there may be further provided a method for compressing data comprising the steps of: detecting a multiplicity of data sets, each of which includes n parameter values that vary according to an operation of an object, where n is a natural number; and compressing the multiple data sets by inputting the multiple data sets detected by the sub-steps of the step of detecting into an n-dimensional space, arranging a predetermined number of neurons which are smaller in number than the multiple data sets in the n-dimensional space, carrying out unsupervised learning of a neural network on the neurons to obtain a neuron model, and calculating neuron model parameters by use of the multiple data sets and the neuron model.

In another aspect of the present invention, the method for compressing data is further characterized in that: the step of compressing comprises a sub-step of determining one neuron of the neurons for each of the multiple data sets which one neuron has the shortest distance to each of the multiple data sets to be a winning neuron; and the neuron model parameters include, for each of the winning neurons, coordinate data representing coordinates of each of the winning neurons, average distance data representing an average of distances of each of the winning neurons to the multiple data sets, and weight data representing how many times each of the winning neurons is determined to be a winning neuron.

In another aspect of the present invention, the method for compressing data is further characterized in that the step of compressing further comprising the sub-step of deleting one or more neurons that have never been determined to be winning neurons.

In another aspect of the present invention, the method for analyzing data comprises the steps of: obtaining the neuron model parameters obtained in the method for compressing data as defined above; and further analyzing the multiple data sets based on the neuron model parameters obtained in the step of obtaining.

In another aspect of the present invention, the method for analyzing data is further characterized in that the step of analyzing is carried out by calculating a moving average of the neurons based on coordinate data and weight data included in the neuron model parameters.

In another aspect of the present invention, the method for analyzing data is further characterized in that the step of analyzing is carried out by calculating a density distribution of the multiple data sets based on the coordinate data, the average distance data, and the weight data included in the neuron model parameters.

Advantageous Effects of the Invention

According to an apparatus and a method for compressing data of the present invention, a multiplicity of data sets (raw data pieces), each of which includes n parameter values, can be compressed into a neuron model parameter which characterizes a neuron model obtained by a predetermined number of neurons smaller in number than the data sets. Since the neuron model parameter (compressed data) obtained as a consequence of compression characterizes the neuron model, i.e., a multiplicity of data sets, it is possible to accurately reproduce the characteristics of the original data sets from the compressed data.

Further, according to an apparatus and a method for analyzing data of the present invention, the original data sets (the raw data) can be analyzed by using the neuron model parameter. In this case, analysis of a moving average of each neuron or of a density distribution of the data sets can diagnose the object.

Still further, a data management system of the present invention can guarantee the advantages of both the above data compressing apparatus and data analyzing apparatus.

BRIEF DESCRIPTION OF THE DRAWINGS

[FIG. 12] A flow diagram showing a succession of procedural steps of analysis using a density distribution of the input data sets.

DESCRIPTION OF REFERENCE NUMBERS 1 data management system
2 hydraulic excavator (object)
3 data compressing apparatus 4 sensors (detecting means)
5 data pre-processing section (pre-processing means)
6 data compressing section (compressing means)
7 sending section (sending means)
8 inputting apparatus (inputting means)
10 data analyzing apparatus
11 receiving section (receiving means)
12 data analyzing section (analyzing means)
13 judging section (judging means)
20 monitor (outputting means)

BEST MODE FOR CARRYING OUT THE INVENTION

An embodiment of the present invention will now be described with reference to the accompanying drawings.

A data management system according to the present embodiment is used for diagnosis as to whether or not a machine such as a construction machine has a problem. Below description will be made in relation to a data management system for a hydraulic excavator serving as a construction machine. An object to which the present data management system is applied should by no means be limited to a hydraulic excavator, and the present invention can be applied to any object which varies with operations or environment.

Figure 1:
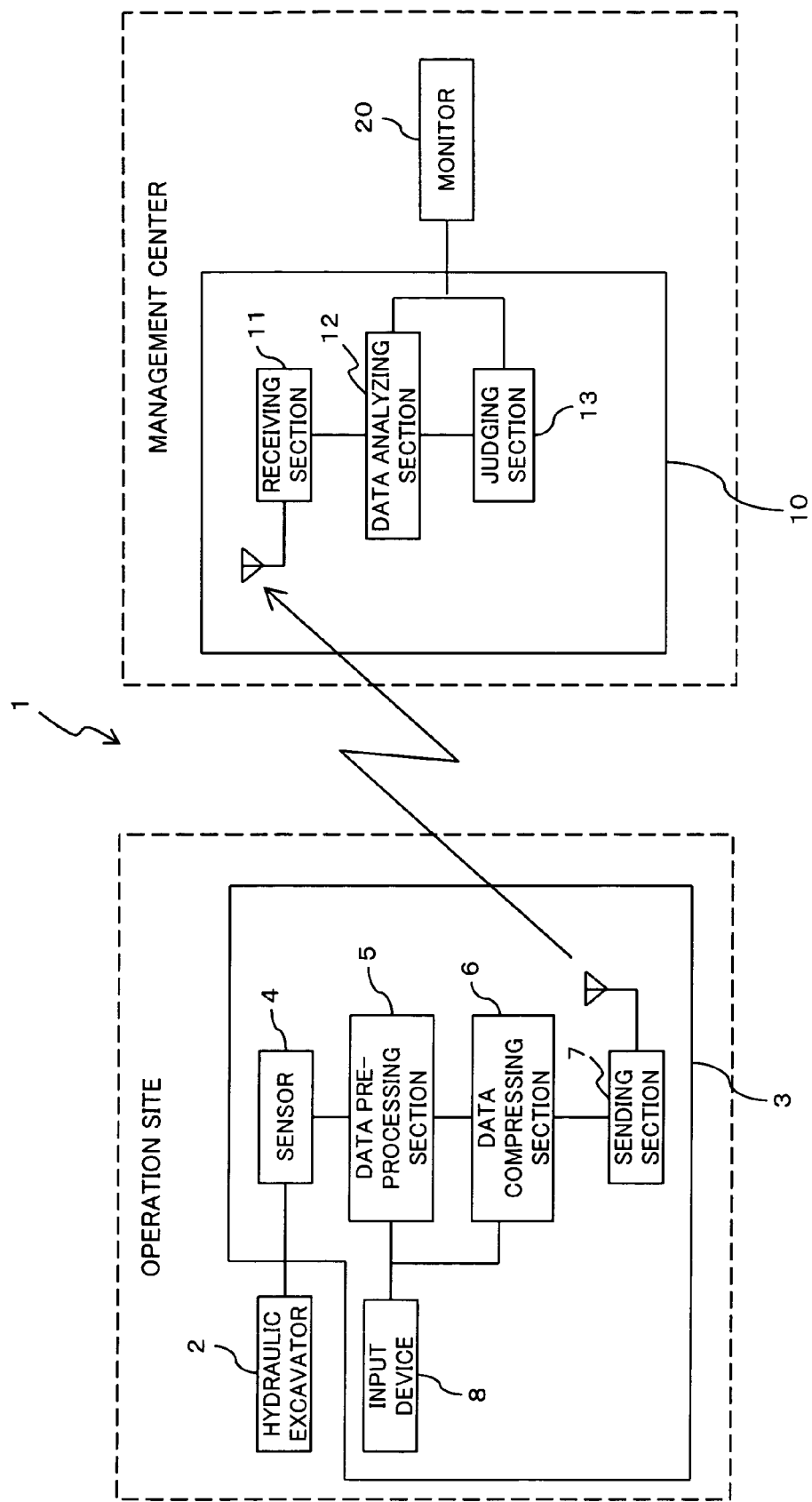
[FIG. 1] A block diagram schematically showing a data management system according to an embodiment of the present invention.

FIG. 1 is a block diagram schematically showing the data management system according to the present embodiment. As shown in FIG. 1, the data management system 1 sends data concerning a hydraulic excavator 2 used at an operation site to a computer in a management center 10 (e.g., a service department of a company in charge of maintenance of the hydraulic excavator 2) that remotely manages the hydraulic excavator 2, and, at the management center 10, the computer estimates and diagnoses a condition of the hydraulic excavator 2 based on the data received from the hydraulic excavator 2. For this purpose, the present data management system 1 mainly includes an on-board data compressing apparatus 3 installed in the hydraulic excavator 2 and the data analyzing apparatus 10 placed in the management center.

The data compressing apparatus 3 includes sensors 4, a data pre-processing section (pre-processing means) 5, a data compressing section (compressing means) 6, a sending section (sending means) 7, and an inputting apparatus (e.g., a keyboard or a mouse) 8, as the main parts. A combination of the sensors 4 and the data pre-processing section 5 functions as detecting means. In order to realize functions of the data pre-processing section 5 and the data compressing section 6, processing programs are installed in an ECU (Electronic Control Unit) of a computer that is however not shown. The ECU has an input/output device, a storage unit (a memory such as a RAM or a ROM), a CPU (Central Processing Unit) and others.

The sensors 4 correspond one to each of the n parameters (variation factors), and, during an operation of the hydraulic excavator 2, detect (measure) parameter values $x_1, x_2, x_3, \ldots, x_n$ which vary in accordance with the operation of the hydraulic excavator 2.

Each sensor 4 may directly detect a corresponding parameter value or may process a detected value through an arithmetic operation to obtain a calculated or estimated value of the corresponding parameter. Here, the parameters concerning the hydraulic excavator 2 are exemplified by engine speed, engine oil temperature, engine oil pressure, engine cooling water temperature, boost pressure (after supercharging), fuel consumption amount, exhaust gas temperature, power shift pressure, hydraulic oil pressure, hydraulic oil temperature, hydraulic oil particles counter, and engine running time, which vary according to an operation of the hydraulic excavator 2.

Figure 9:
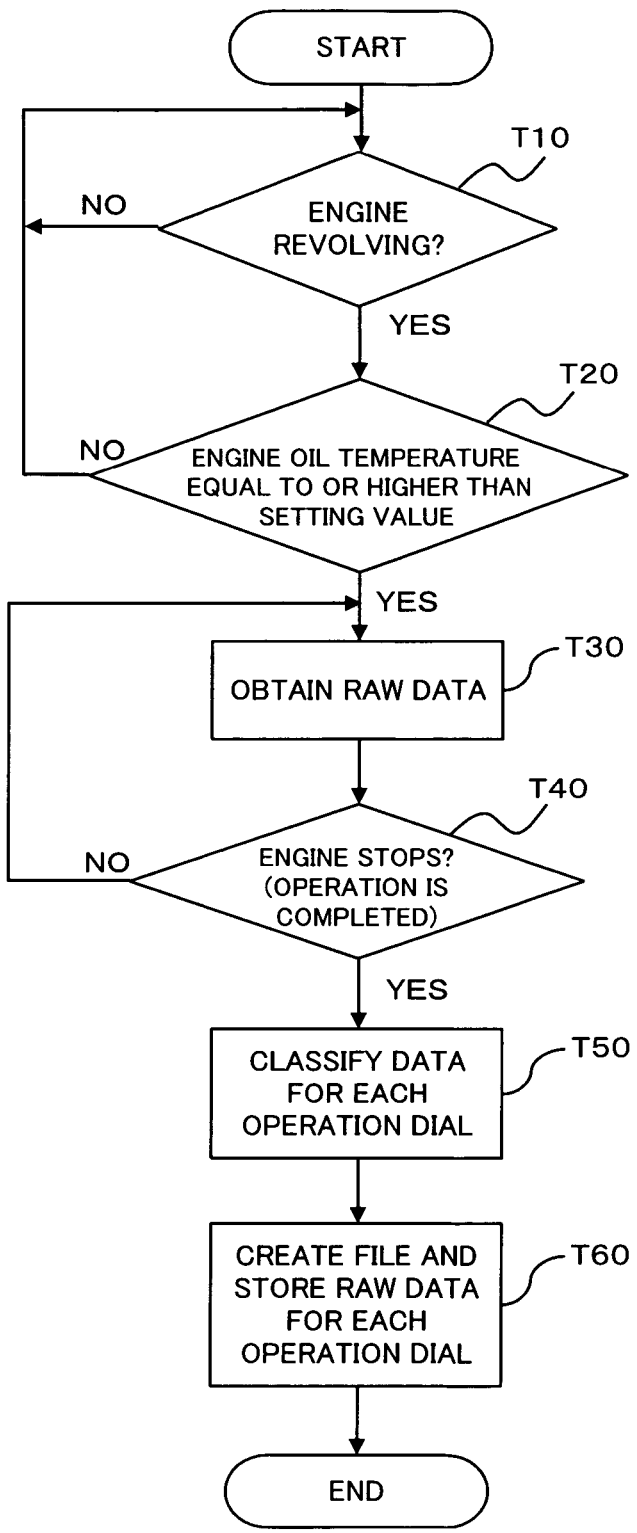
[FIG. 9] A flow diagram showing a succession of procedural steps of data pre-processing.

The data pre-processing section 5 is realized by a processing program (data pre-processing program) as mentioned above, which program carries out a succession of procedural steps of FIG. 9. That is, first of all, the program judges whether or not the engine is turning (step T10), and if the judgment result is positive, further judges whether or not the engine oil temperature is the setting value or higher (step T20). When the engine oil temperature reaches the setting value or higher, the program captures raw data detected by each sensor 4 (step T30), and then judges whether or not the engine stops (step T40). In other words, the program continues to capture the raw data until the engine stops. When the engine stops, the program classifies the raw data for each operation dial (step T50), creates a file for each operation dial and stores the raw data (step T60). An operation dial stands for a dial switch with which the operator sets the engine speed in accordance with an operation (an operational load).

The data pre-processing section 5 will now be detailed.

The data pre-processing section 5 obtains (collects) data sets consisting of the parameter values detected by the sensors 4 at cycles of predetermined second, for example, 1 second, when the engine of the hydraulic excavator 2 starts turning and the engine oil temperature becomes the setting value or higher (i.e., when the hydraulic excavator 2 starts a normal operation), and stores the obtained data sets into a storage unit. Whether or not the engine is turning can be judged by data from a sensor to detect engine speed, and whether or not the engine oil temperature becomes the setting value or higher can be judged by data from a sensor to detect engine oil temperature. In the present embodiment, the cycle of obtaining data from the sensors 4 is set to be 1 second, but can be set to an arbitrary length by an input via the inputting apparatus 8.

The data pre-processing section 5 continues to store data sets consisting of the parameter values from starting to completion (i.e., when the engine stops) of an operation by the hydraulic excavator 2 into the storage unit. After the engine of the hydraulic excavator 2 stops, the data pre-processing section 5 classifies a number of data sets stored in the storage unit for each operation dial to create a file concerning each operation dial, and stores the data sets to corresponding files.

Figure 2:
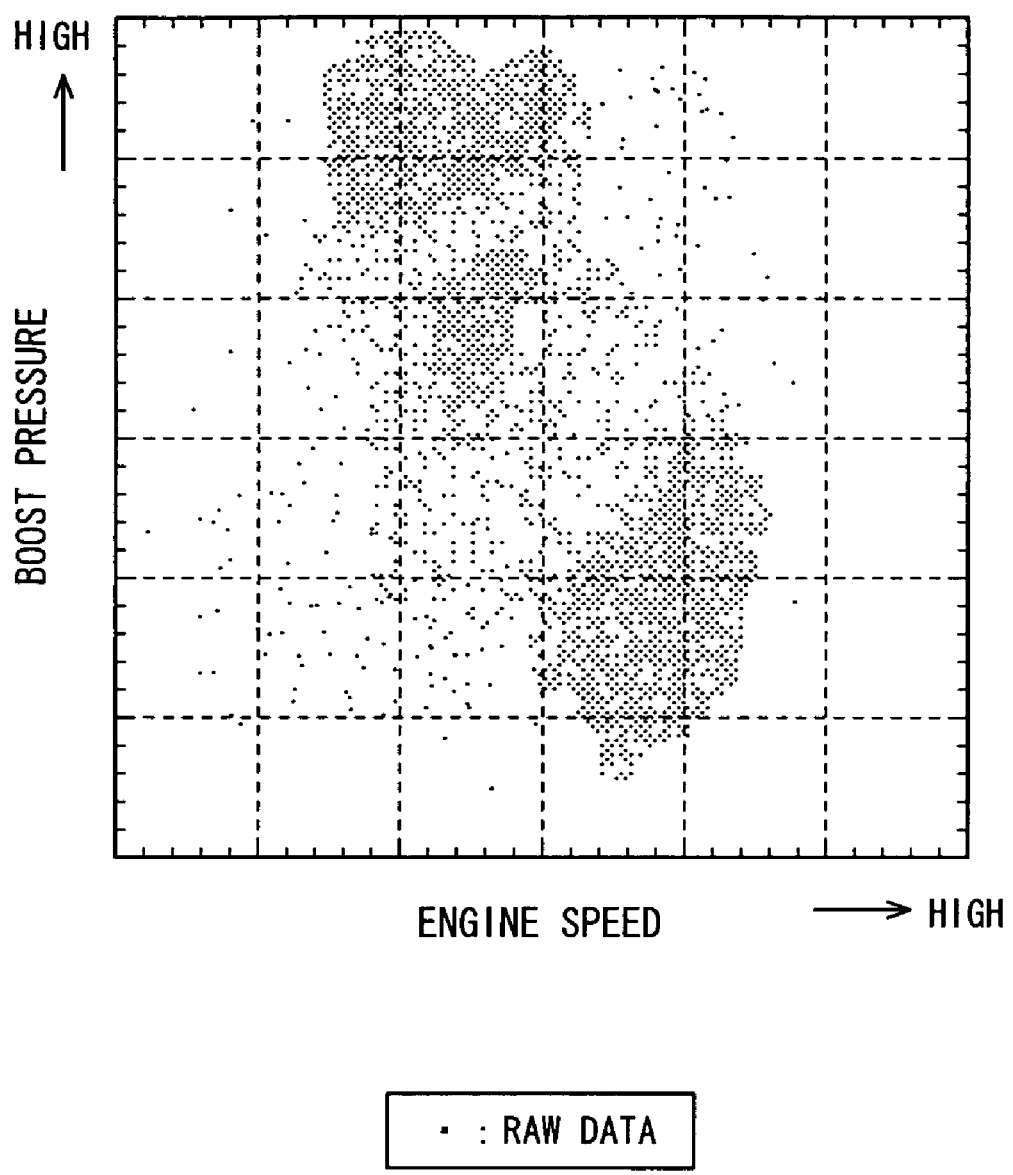
[FIG. 2] A diagram plotting input data sets of the engine speed and the boost pressure concerning a certain operation dial.

Accordingly, the number of data sets stored in each file is a huge number ranging from several thousands to tens of thousands. For example, FIG. 2 is a graph plotting data sets (i.e., raw data) of a relationship between engine speed and boost pressure of a certain operation dial, and the number of data sets is a huge number as the drawing shows. As a matter of course, the axis (abscissa) concerning the engine speed in FIG. 2 represents an engine speed in the range of a normal operation, and similarly, the abscissas in FIGS. 3, 5, 6 and 7 represent an engine speed in the range of a normal operation.

Figure 10:
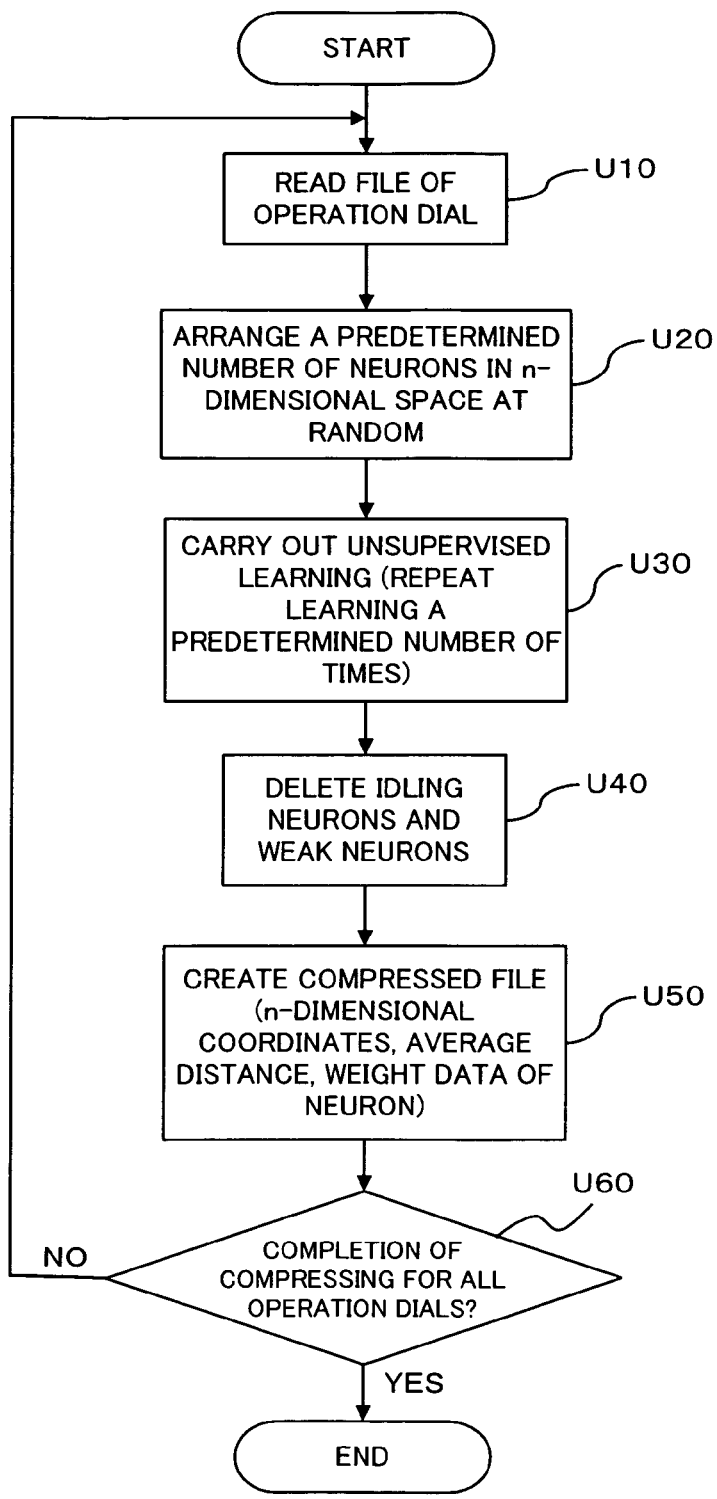
[FIG. 10] A flow diagram showing a succession of procedural steps of data compression.

The function of the data compressing section 6 is realized by a predetermined program (a data compressing program) as described above, and the data compressing program executes the succession of procedural steps shown in the flow diagram of FIG. 10. Specifically, the program reads a file of an operation dial (step U10), then arranges a predetermined number of neurons in the n-dimensional space randomly (step U20), and carries out learning of the neurons (step U30). The learning is repetitiously carried out a predetermined number of times, and idling neurons and weak neurons (that are to be described below) are deleted after completion of the learning (step U40). After that, the program creates a compressed file data (hereinafter simply called a compressed file) including data of n-dimensional coordinates, average distances and weights of neurons (step U50). The above procedure of steps U10 to U50 is carried out for each operation dial (step U60).

Hereinafter, the data compressing section 6 will now be detailed.

The data compressing section 6 functions to compress a huge number of data sets into a very much smaller number of data pieces. The present embodiment is featured by usage of a Self-Organizing Map (SOM), one of the unsupervised learning methods of a neural network, as the data compressing method.

Unsupervised learning is carried out using only data sets that have been input (hereinafter called input data sets) if there is no obvious target value (i.e., an answer), and is carried out based on some principles to be explained below. A self-organizing map consists of an input phase (input data, i.e., a group of the input data sets) and a competition phase (a group of neurons). A self-organizing map is made by an algorithm which carries out learning by automatically extracting features hidden in the input data sets, in other words, by automatically finding out similarity among the input data set by use of arranging similar data set groups in proximity to each other on the network.

Hereinafter, description will now be made in relation to a method for compressing data in the data compressing section 6. The description focuses on compression of input data sets stored in a file concerning a certain operation dial which file is created by the data pre-processing section 5, but data sets in files concerning the other operation dials are compressed in the same manner.

(1) Determination of Learning Conditions:

First of all, learning conditions of the number k of neurons, the initial learning rate $\alpha_0$, the initial neighborhood radius $N_{c0}$, and the total number of times determined to repetitiously carry out learning T are determined which conditions are necessary for calculation to make the distribution of the input data set group be represented by neurons. The setting for these learning conditions can be arbitrarily determined by the inputting apparatus 8 beforehand. An input data set has a configuration of the below formula (1). The number k of neurons is much less than the number l of input data sets (e.g., k is several tens, i.e., k<<l).

$$x_1=(x_{11},x_{12},\ldots,x_{1n})\ x_2=(x_{21},x_{22},\ldots,x_{2n})\ldots x_l=(x_{l1},x_{l2},\ldots,x_{ln}) \qquad (1)$$

where, n represents the number of parameters, and l represents the number of input data sets.

(2) Determination of the Initial Weights of the Input Phase and the Competition Phase:

Next, the data compressing section 6 arranges all the neurons set in the step (1) in an n-dimensional space using random numbers (i.e., randomly), and determines initial connection weight mi between the input phase (the input data set group) and the competition phase (the neuron group) in relation to all the neurons, using random numbers (i.e. randomly). An initial connection weight $m_i$ has a configuration expressed by the following formula (2):

$$m_i=(m_{i1},m_{i2},\ldots,m_{in}), i=1,2,\ldots,k \qquad (2)$$

where, $m_i$ represents a weight vector of the i-th neuron, i represents the ordinal number of a neuron, and k represents the number of neurons initially arranged.

(3) Determination of Vectors of the Input Data Sets:

Then, the data compressing section 6 determines a vector $X_j$ of each input data set. A vector $x_j$ has a configuration of the below formula (3):

$$x_j=(x_{j1},x_{j2},\ldots,x_{jn}), j=1,2,\ldots,l \qquad (3)$$

where, $x_j$ represents the vector of the j-th data set, j represents the ordinal number of a data set, and l represents the number of data sets.

(4) Calculation of Similarity of a Neuron and an Input Data Set:

The data compressing section 6 calculates an Euclidean distance $d_i$ between the i-th neuron and the j-th data set. A Euclidean distance $d_i$ can be calculated by the following formula (4):

$$d_i = \sqrt{\sum_{p=1}^{n}(x_{jp}-m_{ip})^2}, p=1,2,\ldots,n \qquad (4)$$

where, p represents the ordinal number of a parameter and n represents the number of parameters.

(5) Determination of Winning Neurons and the Neighborhood Radii:

A neuron whose Euclidean distance $d_i$ is the smallest (i.e., a neuron that is the most similar) in the step (4) is determined to be a winning neuron of the input data set $x_j$. At the same time, one or more neurons arranged in a predetermined neighborhood radius $N_{ct}$ surrounding the winning neuron are defined as neighboring neuron.

A neighborhood radius $N_{ct}$ can be determined by the following formula (5):

$$N_{ct}=N_{c0}\left(1-\frac{t}{T}\right) \qquad (5)$$

where, $N_{co}$ represents the initial neighborhood radius, t represents the number of times of current learning, and T represents the total number of times determined to repetitiously carry out learning.

(6) Learning of Winning Neurons and Neighboring Neurons:

The weight of a winning neuron $m_c$ is updated by a learning rate $\alpha_t$ and the winning neuron approaches a corresponding input data set. Each selected neighboring neuron also approaches the corresponding input data set by a smaller updating amount than that of the winning neuron. The extent of the updating amount depends on the distance between the winning neuron and neighboring neuron and a neighboring function. The updated winning neuron can be obtained by the following formula (6):

$$m_c^{new} = m_c^{old} + \alpha_t(x_j - m_c^{old}) \qquad (6)$$

$$\alpha_t = \alpha_0\left(1-\frac{t}{T}\right)$$

where, $\alpha_t$ represents a learning rate at the number t of times of learning, t represents the initial learning rate, $m_c^{new}$ represents an updated winning neuron, $m_c^{old}$ represents a winning neuron before updating, t represents the number of times of current learning, and T represents the total number of times determined to repetitiously carry out learning.

(7) Reading the Next Input Data Set:

The above steps (2) through (6) are repetitiously performed for each of input data sets $x_1$ to $x_1$.

(8) Starting of the Next Repetitious Learning:

The above steps of (2) through (7) are repetitiously carried out until the number of times that the learning is carried out reaches the predetermined number T of times to repetitiously carry out learning. At that time the neighborhood radius $N_{ct}$ and the learning rate $\alpha_t$ are gradually reduced.

(9) Deletion of Idling Neurons and Weak Neurons:

After the completion of the above learning, a neuron (called an idling neuron) which has never become a winning neuron and a neuron (called a weak neuron) which has become a winning neuron only a few times (less than a predetermined number of times, e.g., a neuron that represents only one or two input data sets) are deleted.

Figure 3:
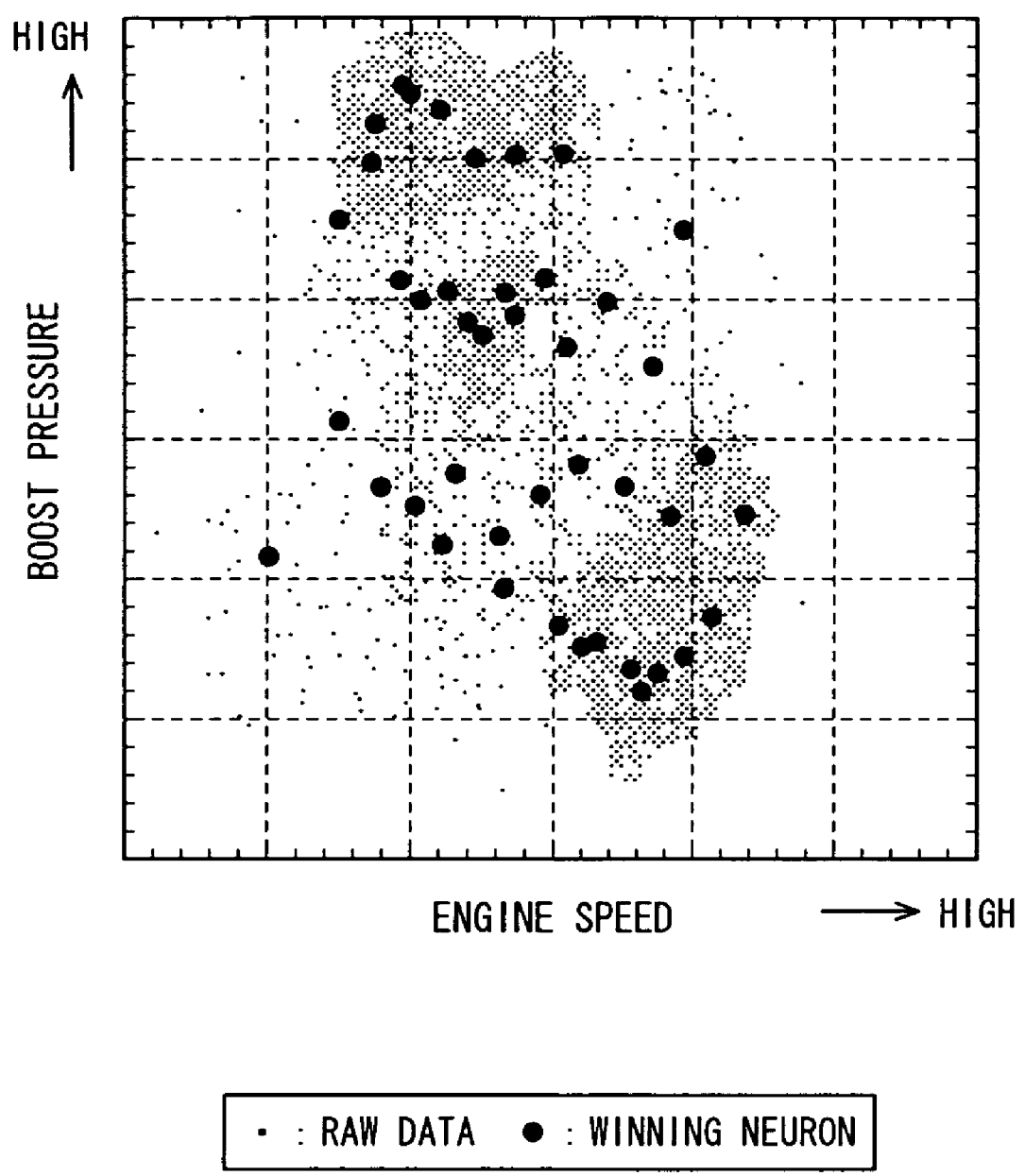
[FIG. 3] A diagram showing the result of conversion of the input data set group of the engine speed and the boost pressure of FIG. 2 into a neuron model (from which idling neurons and weak neurons have been deleted)

As described above, the data compressing section 6 inputs each input data set into an n-dimensional space, randomly arranges a predetermined number k of neurons that is much fewer than the number 1 of input data sets, and carries out unsupervised learning of a neural network on the neurons. After the completion of the learning, the data compressing section 6 deletes idling neurons and weak neurons, so that a huge number of input data sets (i.e., raw data that has been detected by the sensors 4 and is not processed) can be represented by a neuron model (a neuron arrangement) consisting of neurons of the predetermined number k or less. For example, FIG. 3 shows a neuron model (from which idling neurons and weak neurons have been deleted) generated as a result of conversion of the input data set group of engine speed and boost pressure shown in FIG. 2, and as shown in FIG. 3, a huge number of the input data sets are represented by neurons much less in number than the input data sets. In other words, a huge number of input data sets are compressed by converting the input data sets into parameters (hereinafter called neuron model parameters) possessed by neurons characterizing a neuron model. Deletion of idling neurons and weak neurons can compress the input data sets into neurons that characterize the input data sets most intensively.

The neuron model parameters include various information pieces possessed by the neurons remaining after deletion of idling neurons and weak neurons, which pieces are data of the coordinates of the remaining neurons in the n-dimensional space, an average distance of each remaining neuron to the input data sets, and the weight indicating the number of data sets represented by each remaining neuron. As a result, a huge number of input data sets are compressed into a few number of the neuron model parameters of the following formula (7):

$$k_0 \times (2n+1) \quad (7)$$

where, $k_0$ represents the number of neurons remaining after deletion of idling neurons and weak neurons, and n represents the number of parameters.

In other words, a huge number of input data sets are compressed into "neuron model parameters whose number is represented by $k_0$ (the number of neurons remaining after deletion of idling neurons and weak neurons, $k_0 \leq k) \times$[n (the number of data pieces representing components of the coordinate of each neuron, that is the same number as the number n of parameters detected by the sensors 4)+n (the number of data pieces of average distances and corresponds to the number n of parameters detected by the sensors 4)+1 (the number of weight data pieces)]".

The data compressing section 6 carries out the above compression of raw data for each file (i.e., for each operation dial), then creates a compressed file associated with each file in the storage unit and stores the neuron model parameters in the compressed file.

The sending section 7 sends a compressed file created by the data compressing section 6 to an external unit. The present embodiment wirelessly sends files using an antenna but may of course send the file via a communication cable.

In the meanwhile, the data analyzing apparatus 10 at the management center mainly includes a receiving section (receiving means) 11, a data analyzing section (analyzing means) 12, and a judging section 13. Functions of the data analyzing section 12 and the judging section 13 are realized by processing programs installed in an ECU (Electrical Control Unit) in a computer or the like however not illustrated. The ECU includes an input/output device, a storage unit (a memory such as a RAM or a ROM), a CPU (Central Processing Unit) and others.

The receiving section 11 receives a compressed file sent from the data compressing section 6. The received compressed file is stored into anon-illustrated storage unit.

The data analyzing section 12 analyzes the input data sets on the basis of the neuron model parameters included in a compressed file received in the receiving section 11. In the present embodiment, the data analyzing section 12 is realized by some processing programs (data analyzing programs) to be described below in either of the following two methods.

Figure 4:
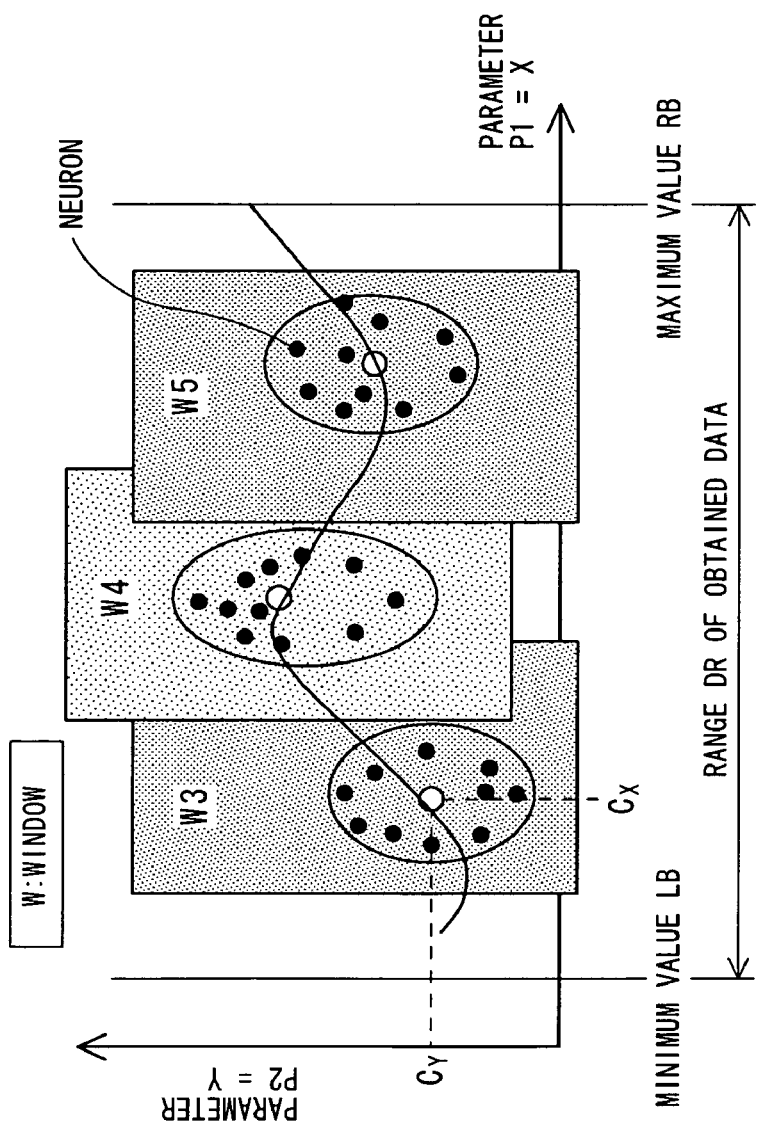
[FIG. 4] A diagram explaining moving averages of neurons considering the weights of the neurons.

(A) Moving Average of Neurons Concerning Weights:

The data analyzing section 12 includes a processing program for realizing analysis using moving average of neurons considering weights of neurons. The processing program carries out a succession of procedural steps of FIG. 11. Specifically, first of all, the program reads a compressed file concerning a certain operation dial (step V10), and selects two arbitrary parameters (e.g., engine speed and boost pressure) (step V20). Since each neuron has data of the coordinate for each parameter (i.e., each measured item), a weight, and an average distance, the relationship between the two arbitrary parameters can be easily obtained. Next, using the coordinate data and the weight data of neurons included in the neuron model parameters, the program determines the maximum value RB and the minimum value LB of one of the neuron, divides a plane of the two arbitrary parameters into a predetermined number of regions (windows) (step V30), and calculates the gravity center point (Cx, Cy) of each window considering weights of the neurons (step V40), as shown in FIG. 4. After that, the program creates a graph of an average movement by connecting the gravity center points of the windows (step V50). The above procedural steps of V20 through V50 are performed on all the n-dimensional parameters (step V60), and then the above procedural steps V20 through V60 are performed on the compressed files concerning all the operation dials (step V70). Each gravity center point is calculated by the below formula (8):

$$C_X^j = \frac{\sum_{i=1}^{N_j} x_i^j w_i^j}{N_j},$$

$$C_Y^j = \frac{\sum_{i=1}^{N_j} y_i^j w_i^j}{N_j}$$

(8)

where, $C_X^j$ represents the center of gravity point of parameter X in the j-th window, $C_Y^j$ represents the gravity center point of parameter Y in the j-th window, j represents the ordinal number of the window (j=1, 2, ..., m), $x_i^j$ and $y_i^j$ represent the coordinate of a neuron in the j-th window, $W_i^j$ represents a weight possessed by a neuron in the j-th window, and $N_j$ represents the number of neurons arranged in the j-th window.

Figure 5:
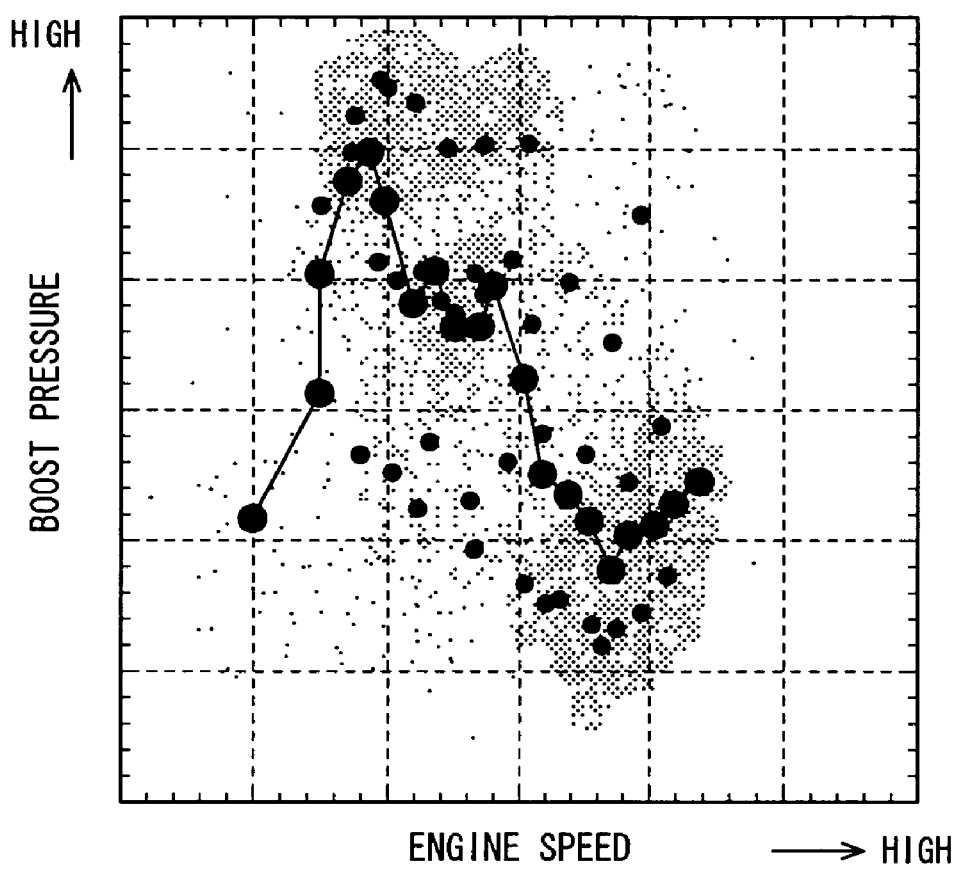
[FIG. 5] A graph showing a relationship between the engine speed and the boost pressure obtained by moving averages of neurons considering the weights of the neurons.
Figure 6:
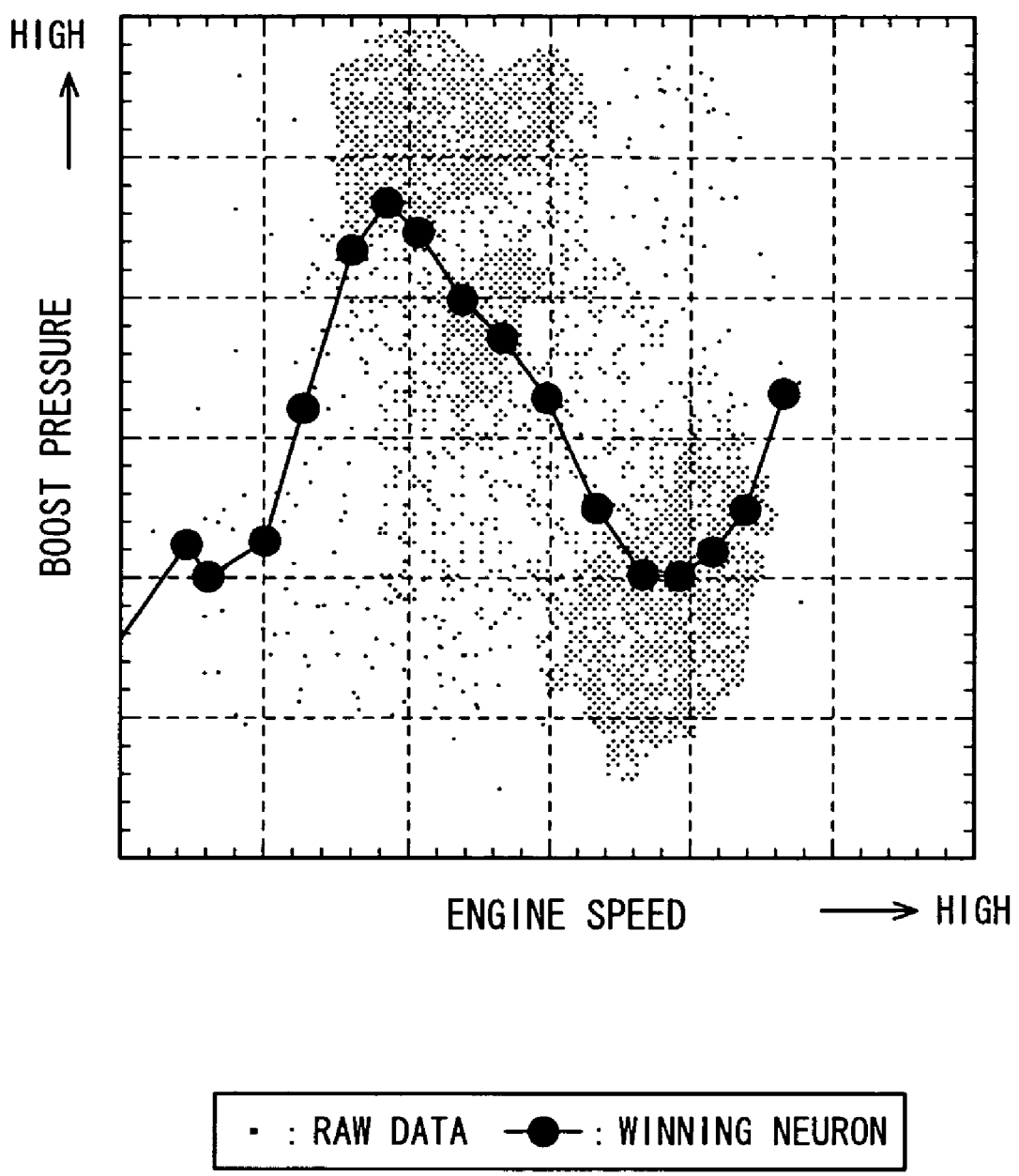
[FIG. 6] A graph of moving averages directly obtained from the input data sets.

The data analyzing section 12 is capable of displaying the graph created in the above manner on the monitor (outputting means) 20. For example, FIG. 5 is a graph showing a relationship between engine speed and boost pressure, which has been obtained by the moving average of neurons considering weight of the neurons. In addition, FIG. 5 shows points of the input data sets (i.e., raw data) and points of neurons that have been subjected to learning. As understood from FIG. 5, the graph of gravity center points obtained by using moving average of neurons is very similar in shape to the input data set group (the distribution of the input data sets). In contrast, FIG. 6 shows a graph of moving averages directly obtained from the input data sets. If only a few input data sets largely protrude from an area of the input data set group, a center of gravity point may deviate from the input data set group. Comparing FIGS. 5 and 6, the graph created by obtaining moving averages of neurons in consideration of weights of the neurons (FIG. 5) reproduces the characteristics of the input data set group more accurately than the graph created by obtaining moving average directly from the input data sets (FIG. 6).

Figure 7:
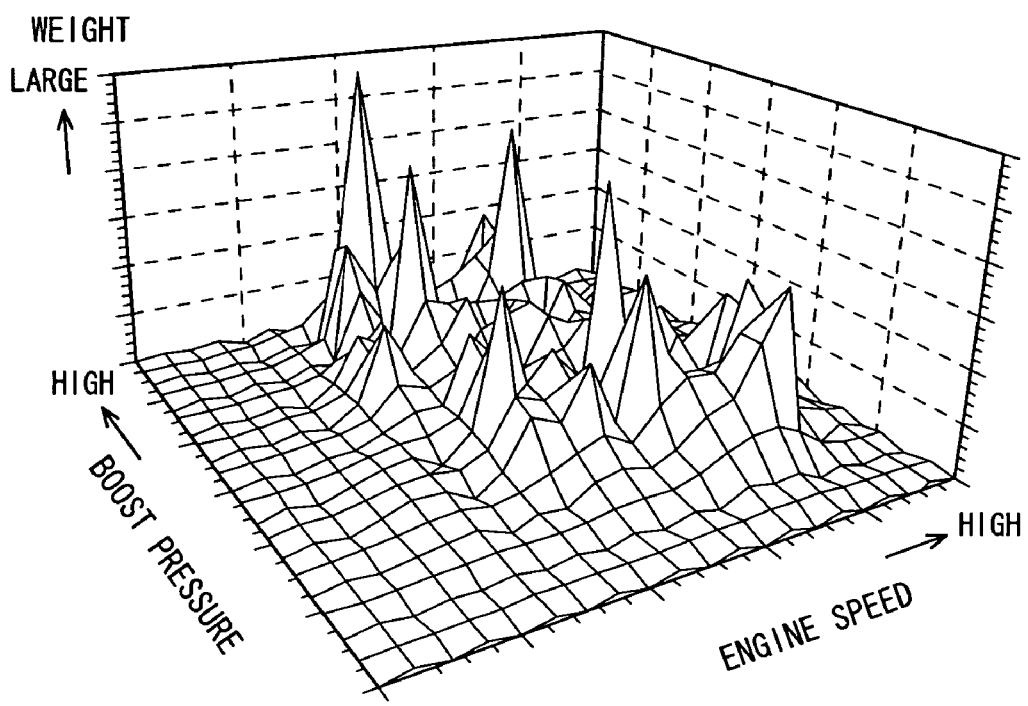
[FIG. 7] A diagram showing a density distribution of the input data sets.

(B) Density Distribution of the Input Data Sets:

The data analyzing section 12 retains a processing program for realizing analysis using a density distribution of input data sets which program carries out a succession of procedural steps of FIG. 12. Specifically, first of all, the program reads a compressed file concerning a certain operation program (step W10) and selects two arbitrary parameters (e.g., engine speed and boost pressure) (step W20). Since each neuron has data of the coordinate for each parameter (i.e., each measured item), a weight, and an average distance as mentioned above, the relationship between the two arbitrary parameters can be easily obtained. Next, using the coordinate data, the average distance data, and the weight data of neurons included in the neuron model parameters, the program creates a three-dimensional graph (here, concerning engine speed, boost pressure and input data density) is created (step W30). In FIG. 7, the position of a neuron obtained by the coordinate data of the neuron corresponds to the position of a peak (mountain's top), and the weight of a neuron obtained by weight data of the neuron corresponding to the height of the peak. The average distance of a neuron to the input data sets which distance obtained by the average distance data of the neuron corresponds to a gradient of the inclined surface of the associated peak. For example, a larger average distance (i.e., input data sets which are relatively low in density are arranged in proximity to a neuron) makes the gradient of the inclined surface of the corresponding peak small (gentle slope). Conversely, a small average distance (i.e., input data sets that are relatively high in density are arranged in proximity to a neuron) makes the gradient of the inclined surface of a peak large (sharp slope). The above procedure of steps W20 and W30 are performed on all the n parameters (step W40), and the procedure of steps W20 to W40 are performed on the compressed files concerning all the operation dials (step W50).

The data analyzing section 12 is capable of displaying a graph created in the above manner on the monitor 20.

As described above, the data analyzing section 12 can analyze neuron model parameters in either of the above two methods. In the above explanation, analyses are performed on the relationship between engine speed and boost pressure. But, analysis is performed on data concerning all the parameters of each operation dial.

The judging section 13 diagnoses the hydraulic excavator 2 based on each graph (actually each data piece of neuron model parameters from which the graph is created) created by the data analyzing section 12. For example, the judging section 13 calculates the similarity of the created graph to a graph featuring a normal operation, and, if the calculated similarity is smaller than a predetermined value (in other words, the created graph has a large deviation from a graph concerning a normal operation), judges that the hydraulic excavator 2 has a problem or a deterioration. In addition, if the hydraulic excavator 2 has a problem, the judging section 13 displays the problem occurrence on the monitor 20 for notification to an operator.

Further, addition of knowledge of the previous maintenance history, and analysis results of the engine oil and the hydraulic-device oil to judgment criteria makes it possible to predict problem occurrence, timing of oil change, and a remaining lifetime of the hydraulic excavator 2.

Figure 8:
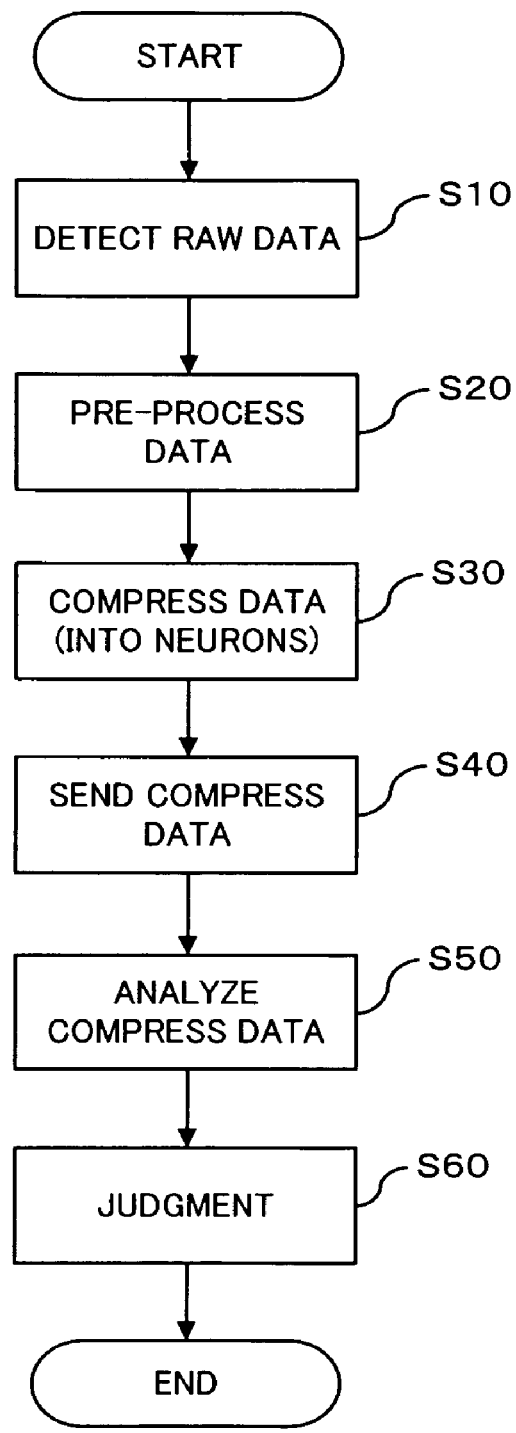
[FIG. 8] A flow diagram showing a succession of procedural steps of data compression and data analysis according to one embodiment of the present invention.

The data management system 1 according to the present embodiment has the above configuration, and data compression and data analysis are realized in the manner described in flow diagram FIG. 8. First of all, the sensors 4 detect raw data (input data sets) of parameters of the hydraulic excavator 2 (step S10), which raw data is then pre-processed (step S20). After that, the raw data is compressed using neurons (step S30), and the compressed data (i.e., neuron model parameters), which is in the form of a compressed file, is sent to the management center (step S40). At the management center, the received compressed data is analyzed (step S50) and judgment is made as to whether or not the hydraulic excavator 2 has a problem (step S60).

Figure 11:
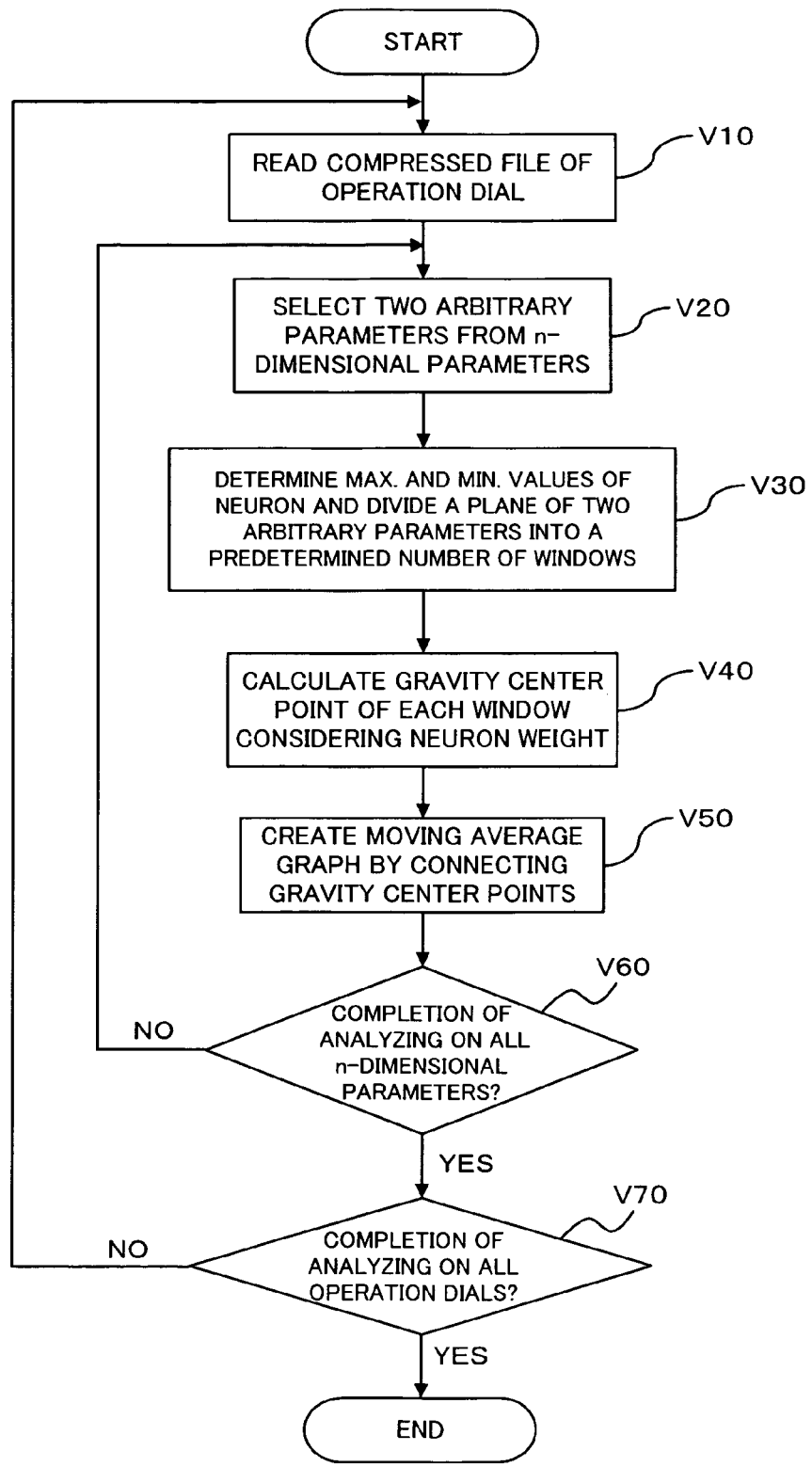
[FIG. 11] A flow diagram showing a succession of procedural steps of analysis using moving averages obtained considering the weights of neurons.

As described above, step S20 of FIG. 8 is performed along the flow diagram of FIG. 9 by the data pre-processing section 5; step S30 of FIG. 8 is performed along the flow diagram of FIG. 10 by the data compressing section 6; and step S50 is performed along the flow diagram of FIGS. 11 and/or 12 by the data analyzing section 12.

As described above, the apparatus and the method for compressing data of the present embodiment can compress a number of input data sets (i.e., raw data, see FIG. 2) each consisting of n parameter values into parameters (neuron model parameters, see FIG. 3), which characterize a neuron model obtained by neurons smaller in number than the input data sets, and communication costs can be thereby reduced. Since such compressed neuron model parameters (compressed data) characterize a neuron model, that is, a number of input data sets, the compressed data can accurately reproduce the characteristics of the original input data sets (i.e., raw data) (see FIGS. 5 and 7).

Further, the apparatus and the method for compressing data of the present embodiment can analyze the original input data sets by using neuron model parameters. In this case, it is possible to diagnose the hydraulic excavator 2 by analyzing the moving averages of neurons (see FIG. 5) or by a density distribution of the input data sets (see FIG. 7).

The data management system of the present invention has the advantages of both of the data compressing apparatus and the data analyzing apparatus which are detailed above.

One embodiment of the present invention has been described as above, but the present invention should by no means be limited to the foregoing embodiment and various changes and modification can be suggested without departing the gist of the present invention. For example, diagnosis is made by the judging section 13 in the present embodiment, but alternatively, the diagnosis may be visually made with reference to differences in graphs displayed on the monitor 20. Further, the present embodiment displays the result of analysis on the monitor 20, but as a substitute for such a display, the result of analysis may be output from a printing device such as a non-illustrated printer and the diagnosis may be made by an operator.

INDUSTRIAL APPLICABILITY

Since a huge amount of data can be compressed and the compressed data can reproduce the characteristics of the original data with accuracy, the present invention has extremely high usability.

What is claimed is:

1. A data compressing apparatus for diagnosing machine characteristics of a construction machine so as to reduce costs of communication between the construction machine and an external unit, comprising:

detecting sensors which detect a plurality of data sets from the construction machine, each of the plurality of data sets including n parameter values that vary according to an operation of the construction machine, where n is a natural number;

compressing means for compressing the plurality of data sets into neuron model parameters so as to reduce costs of communication between the construction machine and the external unit, where the neuron model parameters are representative of the machine characteristics; and sending means for sending the neuron model parameters to the external unit, wherein said compressing means compresses the plurality of data sets by:

inputting said plurality of data sets detected by said detecting sensors into an n-dimensional space;

arranging a predetermined number of neurons which are smaller in number than the plurality of data sets in the n-dimensional space, where the predetermined number is set in accordance with the reduced cost of communication between the construction machine and the external unit;

carrying out unsupervised learning of a neural network on the neurons to obtain a neuron model;

determining one neuron of the neuron model as a winning neuron for each of the plurality of data sets which one neuron has the shortest distance to each of said plurality of data sets; and calculating the neuron model parameters by use of the winning neurons, wherein the neuron model parameters include, for each of the winning neurons, coordinate data representing coordinates of each said winning neuron, average distance data representing an average of distances of each said winning neuron to the plurality of data sets, and weight data representing how many times each said winning neuron has been determined as a winning neuron.

2. A data compressing apparatus according to claim 1, wherein said compressing means deletes one or more neurons that have never been determined as winning neurons after the completion of the unsupervised learning.

3. A method for compressing data for diagnosing machine characteristics of a construction machine so as to reduce cost of communication between the construction machine and an external unit, comprising the steps of:

(a) detecting a plurality of data sets from the construction machine, each of the plurality of data sets including n parameter values that vary according to an operation of the construction machine, where n is a natural number;

(b) compressing said plurality of data sets into neuron model parameters, where the neuron model parameters are representative of the machine characteristics; and (c) sending the neuron model parameters to the external unit;

wherein said step of compressing comprises sub-steps of:

(b1) inputting the plurality of data sets detected by said step of detecting into an n-dimensional space;

(b2) arranging a predetermined number of neurons which are smaller in number than the plurality of data sets in the n-dimensional space, where the predetermined number is set in accordance with the reduced cost of communication between the construction machine and the external unit;

(b3) carrying out unsupervised learning of a neural network on the neurons to obtain a neuron model;

(b4) determining one neuron of the neurons as a winning neuron for each of the plurality of data sets which one neuron has the shortest distance to each of said plurality of data sets; and (b5) calculating the neuron model parameters by use of the winning neurons:

wherein the neuron model parameters include, for each of the winning neurons, coordinate data representing coordinates of each said winning neuron, average distance data representing an average of distances of the one neuron to the plurality of data sets, and weight data representing how many times each said winning neuron has been determined as a winning neuron.

4. A method for compressing data according to claim 3, wherein said step of compressing further comprising the sub-step of (b6) deleting one or more neurons that have never been determined as winning neurons.

* * * * *